(12) United States Patent
Sox et al.

(10) Patent No.: US 7,203,210 B2
(45) Date of Patent: Apr. 10, 2007

(54) METHODS AND DEVICES FOR FORMING A HIGH-POWER COHERENT LIGHT BEAM

(75) Inventors: Daniel J. Sox, Orange, CA (US); Jeffrey H. Hunt, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 561 days.

(21) Appl. No.: 10/748,555

(22) Filed: Dec. 29, 2003

(65) Prior Publication Data

US 2005/0147141 A1    Jul. 7, 2005

(51) Int. Cl.
*H01S 3/10*    (2006.01)
*H01S 3/13*    (2006.01)

(52) U.S. Cl. .................... 372/26; 372/290.011
(58) Field of Classification Search ............... 372/26
See application file for complete search history.

(56) References Cited

U.S. PATENT DOCUMENTS

| | | | |
|---|---|---|---|
| 5,221,989 A * | 6/1993 | Stappaerts et al. | 359/323 |
| 5,430,748 A | 7/1995 | MacCormack et al. | |
| 6,229,940 B1 | 5/2001 | Rice et al. | |
| 6,782,016 B2 * | 8/2004 | Braiman et al. | 372/26 |
| 2003/0010889 A1 * | 1/2003 | Igasaki et al. | 250/201.9 |
| 2003/0103534 A1 | 6/2003 | Braiman et al. | |

FOREIGN PATENT DOCUMENTS

WO  PCT/US2004/042925    7/2005

OTHER PUBLICATIONS

Yaeli J. et al, Array Mode Selection Utilizing an External Cavity Configuration, Applied Physics Letters, American Institute of Physics, vol. 47, No. 2, Jul. 15, 1985, pp. 89-91.

* cited by examiner

*Primary Examiner*—Armando Rodriguez
(74) *Attorney, Agent, or Firm*—Ingrassia Fisher & Lorenz, P.C.

(57) ABSTRACT

A diode laser for providing a high-energy coherent light beam suitably includes an array of laser diodes, each producing a laser beamlet. The beamlets are provided to a spatial light modulator (SLM) with an array of pixels, each pixel corresponding to a portion of the light beam. The phase variation across the light beam wavefront is monitored at a detector, and a feedback signal indicative of the phase variation is provided to control electronics. The control electronics process the feedback signal to modulate a local index of refraction within one or more pixels of the SLM to reduce the variation in phase across the beam wavefront. Because phase variations across the beam wavefront are reduced, relatively large diode arrays can be formulated, thereby resulting in relatively high powered diode lasers.

18 Claims, 3 Drawing Sheets

METHODS AND DEVICES FOR FORMING A HIGH-POWER COHERENT LIGHT BEAM

TECHNICAL FIELD

The present invention generally relates to diode lasers, and more particularly relates to devices and techniques for producing a high-power coherent light beam in a diode laser.

BACKGROUND

The use of laser-generated electromagnetic optical energy has become ubiquitous in applications ranging in areas from commercial to national defense. An illustrative example of the former is the use of optical energy for industrial materials processing, including cutting, welding and surface treatment. End products resulting from such implementations come from such wide ranging business areas as automotive, aerospace, appliance and shipbuilding. More exotic applications can include rock drilling for mining and/or oil and gas exploration purposes. Directed energy or so-called "laser weapons" are finding increased acceptance in the defense community because of the position-sensitive lethality delivery. As lasers become smaller, more efficient and robust, it becomes easier to integrate them into ground-based, sea-based, airborne and space-borne paradigms, thereby further increasing the need for improved lasers and laser components.

Components found in typical lasers include a pump radiation source, a lasing medium, and a resonating cavity. A laser is conventionally classified according to its type of active (i.e. lasing) medium. Several conventional types of lasers include gas lasers, semiconductor lasers, solid-state lasers, excimer lasers, dye lasers and the like. Solid-state lasers (SSLs), for example, have received renewed attention in recent years, especially in high average power (HAP) applications, where large energy delivery allows for implementation in military and/or industrial uses. SSLs typically include a solid-state host material in either crystal or glass form that is doped with suitable rare-earth ions to produce stimulated emissions of light. These ions are optically pumped with light generated by another optical source, such as a semiconductor diode or high intensity flashlamp. After absorption of the pumping light, the ions re-emit the light into the optical resonator, creating a coherent light or laser output. As mentioned above, different types of lasers function in a similar manner, but with different lasing materials.

Diode lasers, generally speaking, are compositionally the same as one or more light emitting diodes. In order for the diode to emit light, electrons are injected into the semiconductor in the conduction band. When the electrons change from the conduction band to the valence band, they emit light, although this light is incoherent without a resonating cavity. In order for a light emitting diode to produce coherent light, the diode semiconductor is placed inside a resonator cavity. The laser light produced can be used for any purpose. Diode lasers have been used, for example, in optical communications systems, as well as in solid state or other lasers as pump light sources.

While diode lasers are generally highly efficient and robust, their usefulness in many applications is limited by the relatively low power of the beam produced. The power may be increased by using multiple diodes to produce beams of a common frequency and phase. Multiple laser diodes, for example, could be used to simultaneously provide pump radiation to a gain medium of a solid state or other laser. Multiple diode lasers could also be used to create a high power beam directly from the semiconductor diodes. In order to accomplish this, the phases of the individual diodes need to be coupled or synchronized with one another. Most commonly, this is accomplished by incorporating a passive optical element that provides a small amount of optical feedback between the individual diodes. While this technique has been employed with some success, the number of diodes that can be coupled together with purely passive elements has been limited in practice by phase differences in light produced by the multiple sources. That is, variations in phase across the wavefront of the resultant beam have restricted the number of diodes that may be simultaneously used in the light source. A tradeoff therefore exists between the power and the phase coherence of the beam, with increases in one resulting in decreases in the other.

It is therefore desirable to create a laser light source capable of producing a high power yet phase synchronous beam of light. It is also desirable to create techniques for operating a light source that produces a high-energy beam. Other desirable features and characteristics will become apparent from the subsequent detailed description and the appended claims, taken in conjunction with the accompanying drawings and this background discussion.

BRIEF SUMMARY

According to various exemplary embodiments, a diode laser for providing a high-energy coherent light beam suitably includes an array of laser diodes, each producing a laser beamlet. The beamlets are provided to a spatial light modulator (SLM) with an array of pixels, each pixel corresponding to a portion of the light beam. The phase variation across the light beam wavefront is monitored at a detector, and a feedback signal indicative of the phase variation is provided to control electronics. The control electronics process the feedback signal to modulate a local index of refraction within one or more pixels of the SLM to reduce the variation in phase across the beam wavefront. Because phase variations across the beam wavefront are reduced through active control, relatively large diode arrays can be formulated.

In another exemplary embodiment, a technique for producing a high-power light beam in a diode laser suitably generates a number of beamlets from an array of laser diodes or other sources to form the light beam. The beam is directed to a spatial light modulator having a number of pixels, each pixel corresponding to one of the beamlets. The light beam is monitored to identify variations in phase between the beamlets. The phase of the various beamlets is then corrected as appropriate by modulating a local index of refraction in one or more pixels of the spatial light modulator to thereby reduce the variations in phase between the plurality of beamlets in the light beam.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

According to various exemplary embodiments, a high power diode laser suitable for laser and other applications is formed from an array of laser diodes or similar sources of light. Light produced by each of the diode sources passes through a spatial light modulator, which adjusts the phase of the light on a localized basis. That is, each pixel of the spatial light modulator suitably adjusts the phase of light passing through that pixel without significantly affecting the phase of light passing through other pixels. By controlling the localized phase of the light across the wavefront of the beam, phase differences can be significantly reduced. Moreover, because phase differences between laser diodes are reduced, larger diode arrays than were previously thought to be practical can be formed, thereby increasing the overall power provided by the diode laser without sacrificing phase synchronicity across the wavefront of the beam. The resulting beam may be used as a pump diode laser for a solid state or other laser, for example, or may be used as a standalone laser for any type of industrial, aeronautics, military or other purpose.

As used herein, the term "substantially" is intended to encompass the specified ranges or values, as well as any variations due to manufacturing, design, implementation and/or environmental effects, as well as any other equivalent values that are consistent with the concepts set forth herein. Although numerical tolerances for various systems and components will vary widely from embodiment to embodiment, equivalent values will typically include variants on the order of fifteen percent or more from those specified herein.

Figure 1:
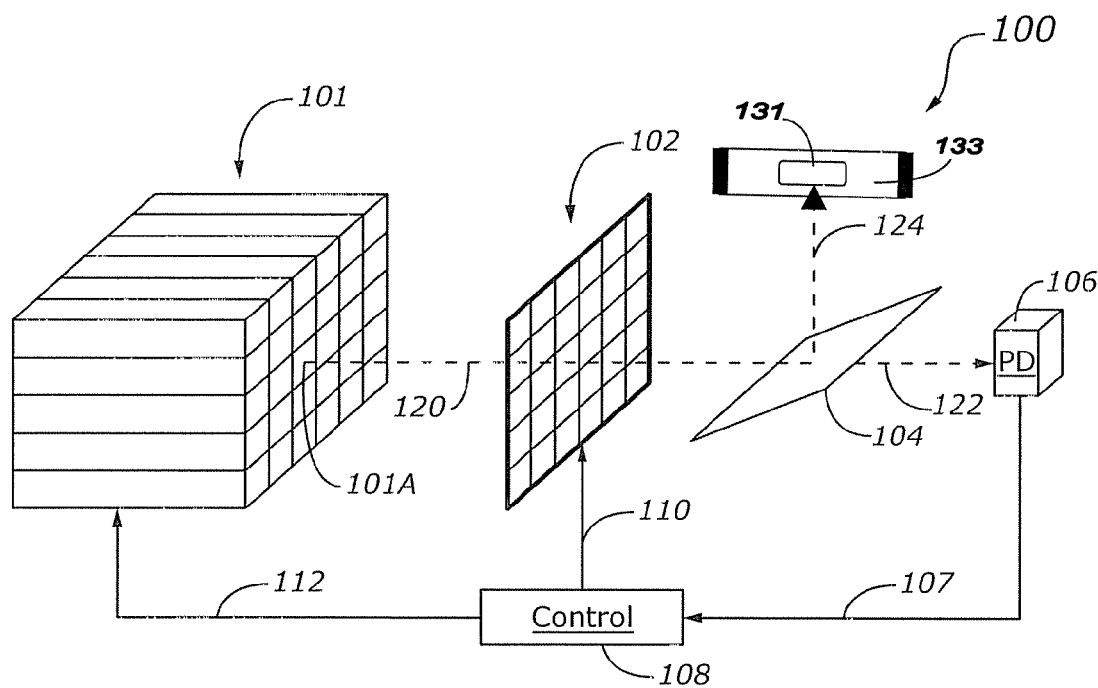
FIG. 1 is a perspective view of an exemplary diode laser.

Turning now to the drawing figures and with initial reference to FIG. 1, an exemplary diode laser 100 suitably includes an array 101 of laser diodes, a spatial light modulator 102, a beam splitter 104, a photodetector 106 and control electronics 108. Light produced by diode array 102 is phase corrected by spatial light modulator 102 to produce a light beam 124 with improved phase symmetry phase coherence. The spatial light modulator is actively controlled by control electronics 108, which receives feedback signals 107 from photodetector 106 and provides control signals 110 to spatial light modulator 102 as appropriate.

Turning now to the drawing figures and with initial reference to FIG. 1, an exemplary diode laser 100 suitably includes an array 101 of laser diodes, a spatial light modulator 102, a beam splitter 104, a photodetector 106 and control electronics 108. Light produced by diode array 101 is phase corrected by spatial light modulator 102 to produce a light beam 124 with improved phase symmetry phase coherence. The spatial light modulator is actively controlled by control electronics 108, which receives feedback signals 107 from photodetector 106 and provides control signals 110 to spatial light modulator 102 as appropriate. Light beam 124 may be directed to a laser gain medium 131 residing proximate to the light source 100 within a lasing cavity 133.

Each laser diode (e.g. diode 100A) in array 102 is capable of producing a beamlet 120 of coherent light radiation. Laser diodes commonly used as pump sources in solid state lasers, for example, typically emit radiation from a surface that is on the order of about 1–2 μm high and about 100–200 μm wide. Such diode elements typically provide an optical output power on the order of about 0.5 to about ten watts, although diodes having any output power could be used in a wide array of alternate embodiments. Moreover, several types of diodes may be purchased in one-dimensional arrays of ten or more diodes (called "diode bars") that typically provide 10 to 100 watts or so of average power. Diode bars may be equipped with electrical terminals and may be mounted on heat exchangers, as appropriate. Moreover, as described above, multiple diode bars may be stacked or otherwise arranged to create two-dimensional arrays 101 that may provide a kilowatt or more of average output power while providing relatively convenient connections for coolant and electrical power. Laser diodes and diode bars are provided from multiple commercial vendors, including Coherent Inc. of Santa Clara, Calif., Industrial Microphotonics Company of St. Charles, Mont., Thompson-CSF of Orsay, France, and others.

Each laser diode (e.g. diode 100A) in array 101 is capable of producing a beamlet 120 of coherent light radiation. Laser diodes commonly used as pump sources in solid state lasers, for example, typically emit radiation from a surface that is on the order of about 1–2 μm high and about 100–200 μm wide. Such diode elements typically provide an optical output power on the order of about 0.5 to about ten watts, although diodes having any output power could be used in a wide array of alternate embodiments. Moreover, several types of diodes may be purchased in one-dimensional arrays of ten or more diodes (called "diode bars") that typically provide 10 to 100 watts or so of average power. Diode bars may be equipped with electrical terminals and may be mounted on heat exchangers, as appropriate. Moreover, as described above, multiple diode bars may be stacked or otherwise arranged to create two-dimensional arrays 101 that may provide a kilowatt or more of average output power while providing relatively convenient connections for coolant and electrical power. Laser diodes and diode bars are provided from multiple commercial vendors, including Coherent Inc. of Santa Clara, Calif., Industrial Microphotonics Company of St. Charles, Mont., Thompson-CSF of Orsay, France, and others.

In various exemplary embodiments, SLM 102 is a dual-frequency liquid crystal retarder similar to those commercially available and widely used in the liquid crystal display industry. Unlike the retarders typically designed for LCD applications, however, the pixels used in SLM 102 need not be inordinately small to be useful. In various embodiments, pixel sizes on the order of 0.5 to 2 mm may be sufficient to provide the level of resolution desired for phase correcting a laser beam wavefront, although larger or smaller pixels could be used in alternate embodiments. Dual-frequency liquid crystal devices may be purchased in sizes of 256×256 pixels or larger, thereby allowing 65,000 or more levels of phase control across the wavefront of beam 120. Alternate embodiments, however, have far fewer pixels, even as few as ten or less, depending on the power levels desired and the size and layout of diode array 101. One embodiment may utilize a SLM formed from a 50×50 pixel array liquid crystal device, for example, with pixel lengths and widths on the order of one millimeter or so. In many embodiments, each beamlet impinges upon multiple pixels in SLM 102.

Dual-frequency liquid crystal retarders typically have an electronic backplane that applies local electric fields relative to a transparent electrode front plane. The electric fields cause modulation in a local index of refraction within a liquid crystal pixel located between the frontplane and backplane, which in turn causes the length of the optical path through the pixel to change, which in turn modifies the phase of a light wave (e.g. beamlet 120) passing through the pixel. Dual-frequency SLMs 120 may be particularly effective in some embodiments due to the relatively high speed response provided by such devices. Specifically, non dual-frequency liquid crystal spatial light modulators typically have response times on the order of one millisecond. This relatively long time response is not generally fast enough to correct for phase fluctuations, which are typically on the order of one microsecond.

The nature of the dual-frequency spatial light modulators allows operation with response times on the order of one microsecond so that spatial light modulators with dual frequency liquid crystals can be used to correct local phase at sufficiently high speeds. Such devices may be readily switched between two states (corresponding to two separate states of the pixel dipole) by applying an electric field of varying frequency. Such devices typically remain in a normal pneumatic state when a relatively low frequency field (e.g. on the order of 5 kHz) is applied to the pixel, yet may be driven to an opposite state by applying a relatively high frequency (e.g. on the order of 50 kHz) field. Switching speeds may be further improved by increasing the intensity of the applied field. Alternate embodiments may use dual frequency devices with significantly higher or lower operating frequencies; still other embodiments may not use dual-frequency devices at all, but may rather employ single frequency crystals, or alternate technologies entirely such as analog ferroelectrics or quantum wells instead of liquid crystals.

The various phase-modulating pixels of SLM 102 may be controlled in any manner. In one embodiment, beam 120 is monitored at a photodetector 106, which receives a portion 122 of the light emanating from SLM 102 as appropriate. The remaining light 124 is provided as an output beam of diode laser 100. Light portions 122 and 124 may be separated from beam 120 by a conventional beamsplitter 104 or similar structure. Typically light portion 122 will be further processed (e.g. as described below in conjunction with FIG. 3 or 4) to create an interference pattern that can be used to identify phase differences across the wavefront of beam 120. To that end, photodetector 106 may be implemented with a photodiode, charge coupled device (CCD) or other sensor capable of converting optical signals to electrical equivalents 107 in any analog and/or digital format. Various types of photodetectors 106 are available commercially, and practical embodiments will typically incorporate multiple photodiodes or other sensing devices to improve the sensing resolution across the beam 122 wavefront.

Control electronics 108 are any digital and/or analog processing circuitry and associated software, firmware or the like used to control SLM 102 as appropriate. In an exemplary embodiment, control electronics 108 is implemented with a microprocessor or microcontroller-based computing system with associated input/output circuitry and digital memory for storing data and instructions executable by the processor/controller as appropriate. In operation, control electronics 108 suitably receive one or more feedback signals 107 from photodetector 106 and process the feedback data to create appropriate control instructions 110 for SLM 102. In a further embodiment, control electronics 108 also provide control instructions 112 to one or more diodes 102A within diode array 102. Such controls may be useful in modulating or otherwise adjusting the amplitude or power on/off state of one or more diodes to create desired power levels in the laser beam produced by diode laser 100. Light source control instructions 112 are optional, however, and will not be found in all embodiments.

Control electronics 108 are any digital and/or analog processing circuitry and associated software, firmware or the like used to control SLM 102 as appropriate. In an exemplary embodiment, control electronics 108 is implemented with a microprocessor or microcontroller-based computing system with associated input/output circuitry and digital memory for storing data and instructions executable by the processor/controller as appropriate. In operation, control electronics 108 suitably receive one or more feedback signals 107 from photodetector 106 and process the feedback data to create appropriate control instructions 110 for SLM 102. In a further embodiment, control electronics 108 also provide control instructions 112 to one or more diodes 102A within diode array 101. Such controls may be useful in modulating or otherwise adjusting the amplitude or power on/off state of one or more diodes to create desired power levels in the laser beam produced by diode laser 100. Light source control instructions 112 are optional, however, and will not be found in all embodiments.

Figure 2:
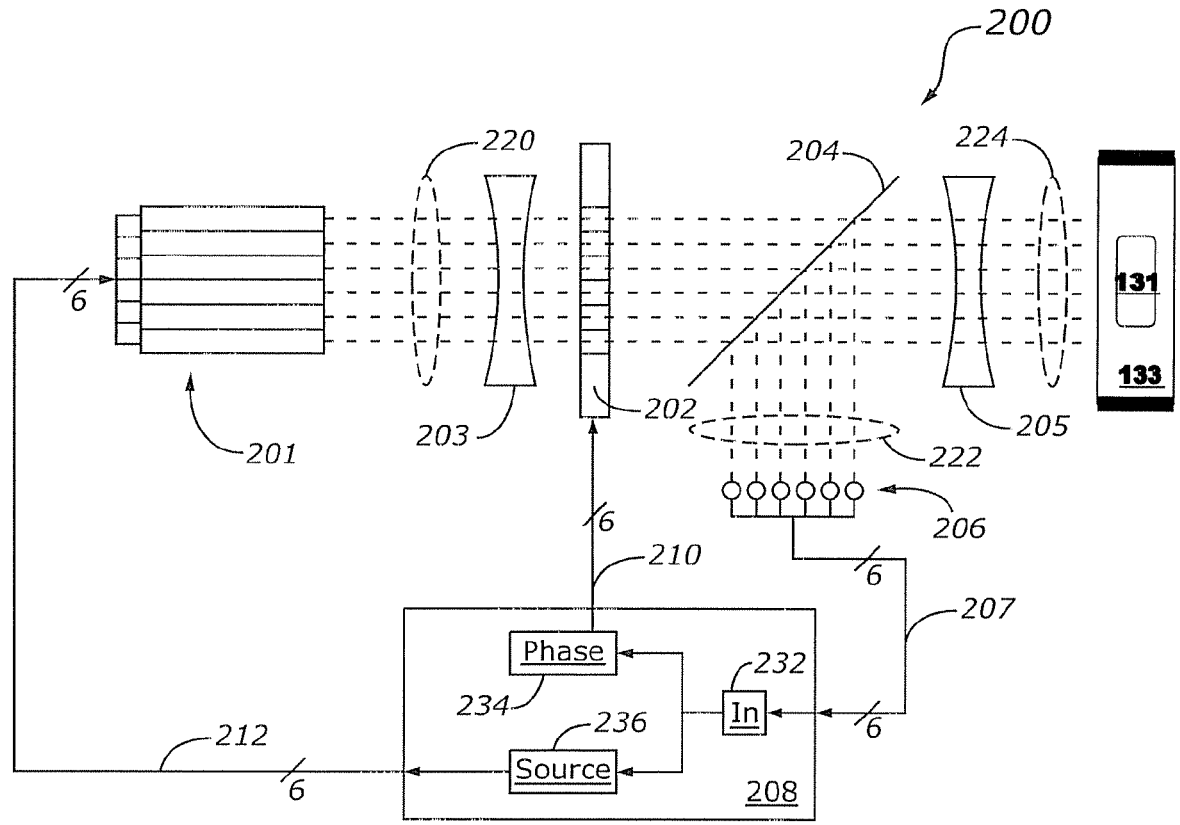
FIG. 2 is a block diagram of an exemplary diode laser.

With reference now to FIG. 2, an alternate embodiment of a diode laser 200 showing additional detail suitably includes an array of laser diodes 201, a spatial light modulator 202, a beam splitter 204, and optional coupling optics 203 and 205 as appropriate. Diode laser 200 also includes any number of photodetectors 206 providing a multiplicity of feedback signals to control electronics 208, which in turn processes the feedback data to produce various control signals 210 to SLM 202, and optionally control signals 212 to diode array 201. As in the previous embodiment, diode array 201 may have any number (e.g. dozens, hundreds or even thousands) of laser diodes arranged in any fashion. The various beamlets produced by the various diodes collectively form laser beam 220, which is ultimately split into an output beam 224 and a sensing portion 222 by beam splitter 204. Output beam 224 may be directed, for example, to a laser gain medium 131 disposed within a lasing cavity 133.

With many commercially-available laser diodes, the beamlet of radiation emitted can be highly asymmetric in shape. In practice, the beamlet produced by a conventional diode is frequently somewhat divergent (e.g on the order of about 30–60 degrees full-width at half maximum) in the direction parallel to the short axis of the diode, and moderately divergent (e.g. about 8–12 degrees full-width at half maximum) in the direction parallel to the long axis of the diode. Spatial profiling of such beamlets is therefore approximately bi-gaussian, with an elliptical cross-section, although other diodes may produce beamlet cross-sections that are elliptical, round or any other shape.

To improve the coupling efficiency of radiation emanating from diode array 201 toward the pixels of SLM 202, coupling optics 203 may be optionally provided. Coupling optics 203 is any lens or collection of lenses used to direct the various beamlets toward the pixels of SLM 202. In various embodiments, one or more separate lenses are optically positioned between diode array 201 and SLM 202 to focus light upon the various pixels more accurately. Alternatively, coupling optics 203 may be implemented with various microlenses formed on individual diodes of diode array 201, or in any other manner.

Similarly, coupling optics 205 may be optionally provided to focus output beam 224 as desired for various purposes. In embodiments wherein diode laser 200 is providing pump light to another laser, for example, it may be desirable to concentrate the bulk of the optical energy in a relatively small space to increase the amount of power provided to a particular area of the target laser's gain medium. Conversely, it may be desirable to spread the optical energy across a large section of the gain medium in various alternate embodiments. Accordingly, optics 205 may include any converging or diverging lens or lenses, or may be omitted entirely depending upon the particular implementation of diode laser 200.

As shown in FIG. 2, control electronics 208 uses multiple data channels to obtain feedback data 207 and to provide control signals 210 and 212. These multiple channels reflect that various regions of the wavefront of beam 220 may be monitored and/or modified by SLM 202 as appropriate. Detector 206, for example, suitably obtains information about multiple portions of beam 222 so that localized fluctuations in phase may be readily identified. Similarly, the various control signals provided to diode array 201 and SLM 202 reflect that certain laser diodes and/or pixels can be selectively adjusted to respond to the fluctuations identified by detector 206. The various feedback signals 207 and/or control signals 210/212 may be provided in serial and/or parallel format, as appropriate, over any number of conducting media. In this manner, electronics 208 provide active control of diode laser 200, resulting in greatly increased power in beam 224 without the previously-associated tradeoffs in phase symmetry phase coherence.

Control electronics 208 suitably include various processing modules 232, 234, 236 as appropriate. The various processing modules may be implemented in hardware, software or any combination thereof, and are intended merely as logical examples describing the high-level functions of control electronics 208. Practical embodiments may have additional logical modules, or may be logically arranged in an entirely different manner. An example of one logical process executed within various embodiments of control electronics 208 is provided below in conjunction with FIG. 5.

Input module 232 suitably receives feedback signals 207 from detector 206 in any manner. Module 232 also places the data received into a format that can be readily processed by modules 234 and 236. Accordingly, input module 232 demultiplexes any signals sent in serial format, performs analog to digital conversion as needed, and/or otherwise prepares feedback data signals 207 for further processing as appropriate to the particular embodiment.

Phase modulation control module 234 suitably receives feedback data 207 from input module 232 and produces any number of control signals 210 to SLM 202 as appropriate to correct for localized fluctuations in phase within beam 220. Various embodiments of SLM 202 receive inputs in the form of row and column addressing for a particular pixel, as well as a magnitude for a desired shift in the index of refraction within the identified pixel. Alternatively, SLM 202 may receive an analog or digital control signal that directly or indirectly controls the magnitude and/or frequency of the electromagnetic field applied across the various pixels using any conventional technique.

Similarly, optional light source control module 236 provides control signals 212 to some or all of the laser diodes in array 201. These control signals may be in any analog or digital format, and may be used to activate, deactivate and/or to change the intensity of light produced by the various diodes in array 201. Again, the various processing modules contained in practical implementations may contain alternate or additional functions, or may be organized in widely different manners to those described herein.

Figure 3:
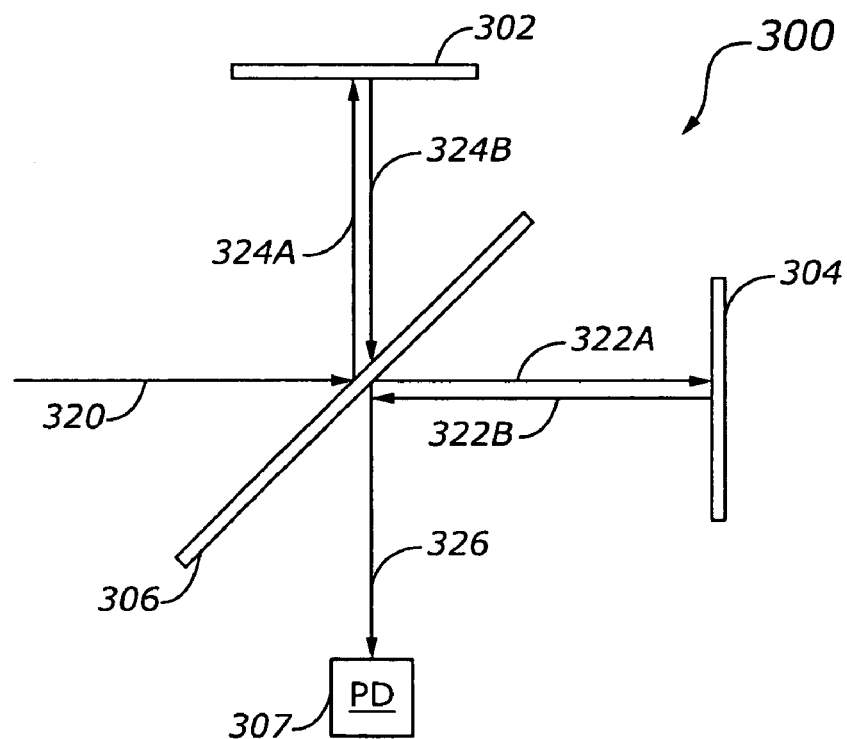
FIG. 3 is a block diagram of an exemplary phase detecting arrangement using a Michelson interferometer.
Figure 4:
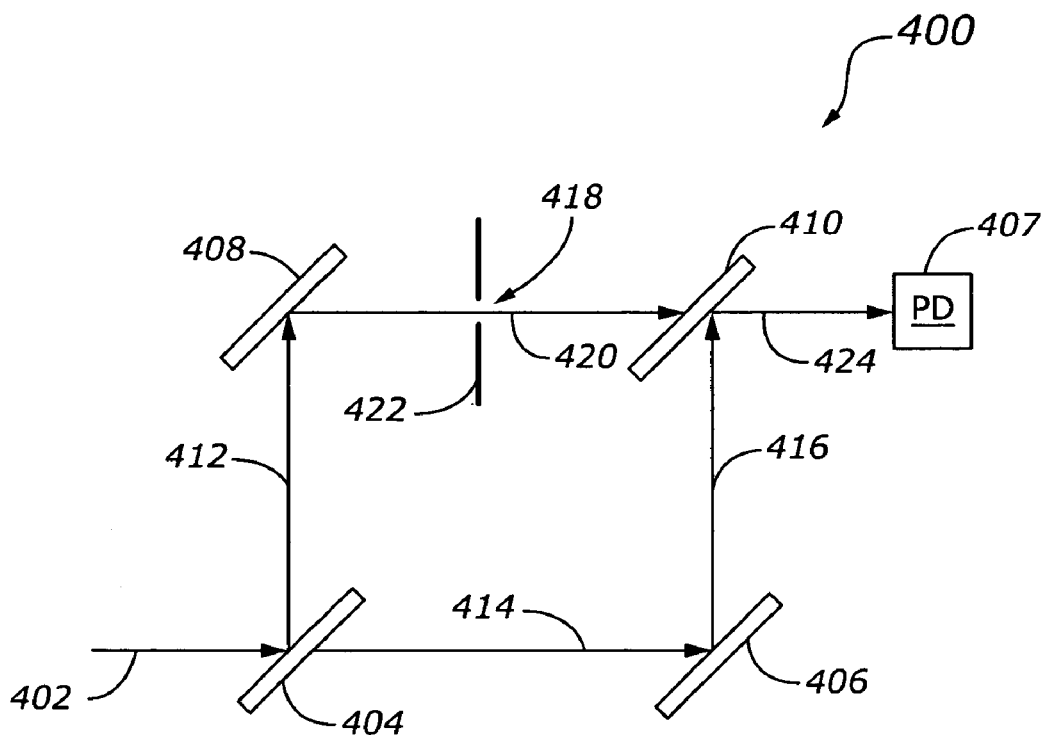
FIG. 4 is a block diagram of an alternate exemplary phase detecting arrangement using a Mach-Zender interferometer.

Referring now to FIGS. 3 and 4, two techniques for detecting changes in phase in beam 220 (FIG. 2) are shown. In general, there are many techniques presently known or subsequently developed that may be used to measure the phase of the wavefront of an electromagnetic beam, and any of these techniques may be used with the systems and devices described herein. Rather than detecting phase directly, most conventional phase measurement techniques use indirect measurement techniques whereby a beam of unknown phase is interfered with a beam of known phase. The intensity distribution in the interference pattern may then be used to deduce the phase of the unknown beam. As an example, if the known and unknown beams are perfectly in phase, the intensity of the interference pattern will be relatively high, since the two beams constructively interfere. If the beams are perfectly out of phase (e.g. shifted by 180 degrees), the intensity will be zero (or very small) due to destructive interference between the waves. Intermediate phase differences will produce intermediate intensity in the interference pattern.

With reference to FIG. 3, one technique for identifying phase differences in laser beam 220 (FIG. 2) suitably uses a Michelson interferometer 300. In this embodiment a beam 320 impinges upon a beam splitter 306 that splits beam 320 into two components. The first component, reference beam 322A, is transmitted to a flat mirror 304 that does not affect the phase of the beam, but merely reflects beam 322B back to beamsplitter 306. The other component 324A is reflected by beamsplitter 306 toward an optical component 302, which reflects the affected beam 324B back toward beamsplitter 306. The two beams 322B and 324B are then recombined to form an interference pattern 326 that can be detected at detector 307. With an input beam 320 that has a well-characterized phase, the interference pattern 326 can be used to read the phase characteristics of beam 324B at detector 306. Variations in intensity across interference pattern 326, for example, are indicative of phase fluctuations in those portions of the beam.

Referring now to FIG. 4, similar concepts may be applied with a Mach-Zender interferometer 400. In this case, the input beam 402 is split into two paths 412 and 414 with a conventional beam splitter 404. Beam 414 may be reflected by mirror 406, but is otherwise left essentially undisturbed. Beam 412 is reflected by mirror 408 and passed through a pinhole 418 in a screen 422 or the like so that the phase of beam 420 is well characterized. The beams 416 and 422 are then recombined at mirror 410, and an interference pattern is produced that can be read by detector 407 as appropriate. While these two interferometric techniques of identifying phase fluctuations have been discussed herein, alternate embodiments may use different interferometric and/or other techniques to identify variations in phase within beam 220. These phase differences can be used to produce feedback signals 207, as described above.

Figure 5:
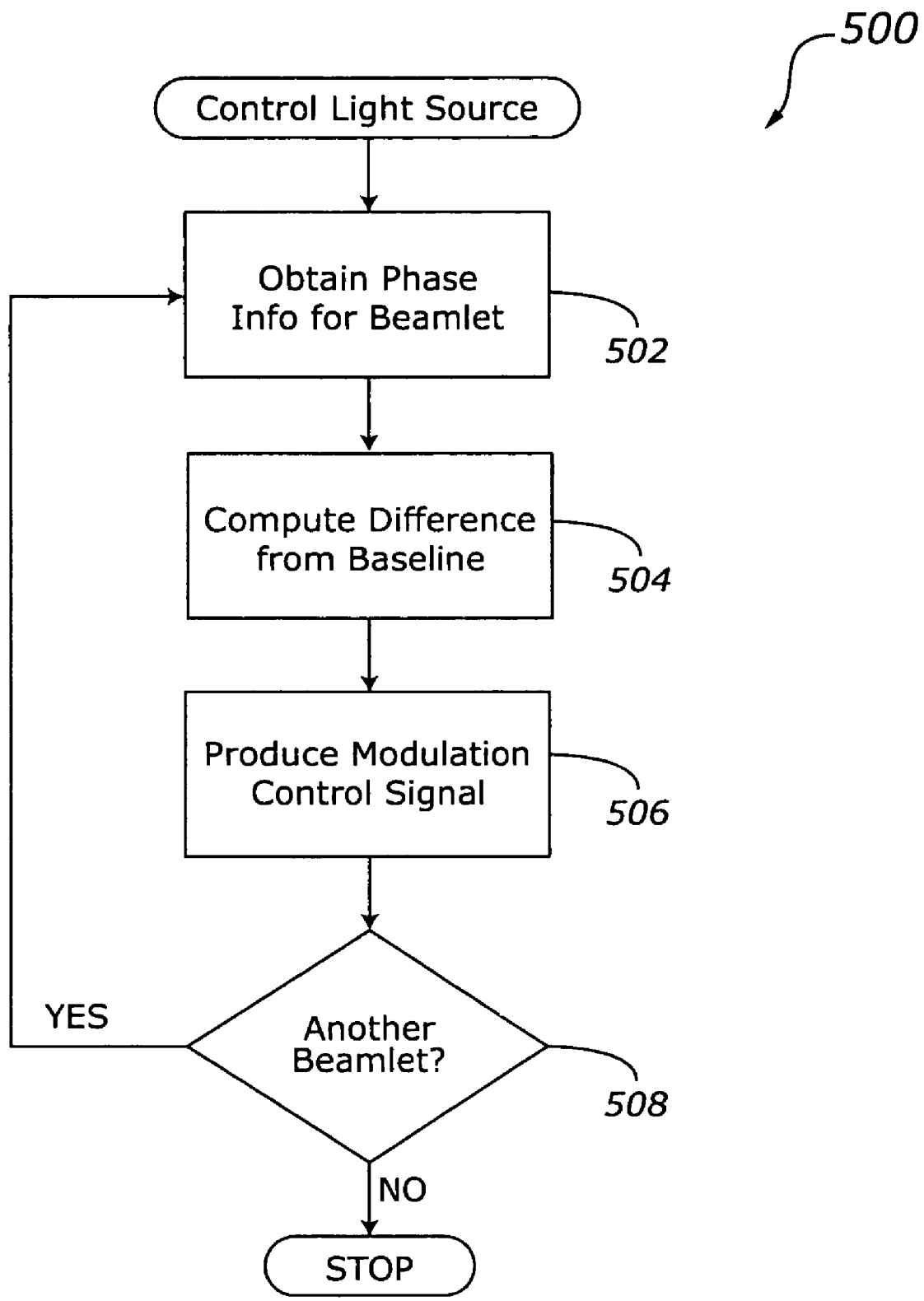
FIG. 5 is a flowchart of an exemplary process for controlling a spatial light modulator in an exemplary diode laser.

With final reference now to FIG. 5, an exemplary process 500 for controlling the light produced in a diode laser (e.g. diode lasers 100 or 200 above) suitably includes the broad steps of obtaining phase information for a portion of the beam wavefront (step 502), identifying any differences between the observed phase information and a baseline or reference phase (step 504), and producing a modulation control signal (step 506) to reduce the differences identified in step 504. The process may be repeated (step 508) for additional regions of the wavefront as appropriate. While FIG. 5 shows one process for controlling the diode laser, alternate embodiments of diode lasers 100, 200 may use widely differing processing techniques that vary significantly from those described herein.

Exemplary process 500 suitably begins by obtaining phase information (step 502) for a portion of the laser beam (e.g. beam 220 in FIG. 2). This portion may correspond to a particular beamlet produced by a particular laser diode in array 101/201, and information may be obtained using any of the techniques described above.

As phase information is received, this information can be compared to a baseline phase value (step 504) to determine if the phase for that beamlet/beam portion is in need of adjustment. The baseline value may be obtained in any manner. It may be an average value computed from the various observations of the wavefront, for example, or it may be an empirically selected value or the like. If the observed portion of the wavefront differs from the baseline by an excessive amount (e.g. 1%, 5%, 10%, etc. depending upon the particularity of the application), then correction may be appropriate.

In such cases, a control signal 210 is produced (step 506) and provided to SLM 102/202 to place the pixel associated with the observed beamlet or region into a desired modulation state. As described above, this control signal 210 may apply an electromagnetic field to a particular pixel to align the pixel dipole in a particular direction, for example, or may otherwise affect the index of refraction within the particular pixel so that the phase of that beamlet is adjusted as appropriate. This process 500 may be repeated as desired for additional beamlets or other portions of beam 220 as appropriate (step 508).

Accordingly, a new diode laser is described that is able to support larger diode arrays through the use of active phase control. The laser diodes in the array produce beamlets that propagate through optional coupling optics onto pixels in a spatial light modulator. The modulator allows the phases of the various beamlets to couple to each other, allowing the array to produce a phased output. In a further embodiment, a photodetector measures the wavefront on the beam output and provides feedback control to the SLM to further improve the phase synchronicity of the output beam. Through the use of a spatial light modulator and feedback-based control, the performance of a diode array can be very accurately controlled, resulting in much larger diode arrays, and correspondingly much higher average power output from the diode laser.

Although various devices and techniques illustrated herein are frequently described with respect to a diode laser with a dual-frequency spatial light modulator, the concepts of localized phase modulation may be applied to any other laser or other optical device. Equivalent embodiments to those described herein may incorporate diode arrays of any shape, structure and/or size, for example, or may provide localized phase modulation using analog ferroelectric or quantum well-based devices rather than the dual-frequency liquid crystal devices predominantly described above. Further, the various process steps described herein may be practiced in any temporal order, or multiple steps may be practiced concurrently in a wide array of equivalent embodiments.

While at least one exemplary embodiment has been presented in the foregoing detailed description, it should be appreciated that a vast number of equivalent variations exist. It should also be appreciated that the exemplary embodiments described herein are only examples, and are not intended to limit the scope, applicability, or configuration of the invention in any way. Rather, the foregoing detailed description will provide those skilled in the art with a convenient road map for implementing an exemplary embodiment of the invention. Accordingly, various changes may be made in the function, arrangement and order of elements and process steps without departing from the scope of the invention as set forth in the appended claims and their legal equivalents.

What is claimed is:

1. A laser for providing a coherent light beam, the laser comprising:
    a plurality of laser diodes arranged in an array, wherein each of the plurality of laser diodes is configured to produce one of a plurality of beamlets;
    a spatial light modulator (SLM) configured to receive the plurality of beamlets and to adjust the phase of at least one of the plurality of beamlets in response to a control signal;
    a detector configured to receive at least a portion of the plurality of beamlets and to produce a feedback signal indicative of the phase of at least one of the plurality of beamlets;
    control electronics configured to receive the feedback signal from the detector and to produce the control signal for the spatial light modulator as a function thereof to reduce phase variations across the wavefront of the coherent light beam; and
    a gain medium disposed within a lasing cavity and configured to receive the coherent light beam.

2. The laser of claim 1 further comprising a lens displaced between the array of laser diodes and the spatial light modulator.

3. The laser of claim 1 further comprising a beamsplitter displaced between the spatial light modulator and the light detector.

4. The laser of claim 3 wherein the beamsplitter is configured to separate the portion of the plurality of beamlets to the light detector from the coherent light beam.

5. The laser of claim 1 wherein the light detector comprises an interferometer.

6. The laser of claim 5 wherein the interferometer is a Michelson interferometer.

7. The laser of claim 5 wherein the interferometer is a Mach-Zender interferometer.

8. The laser of claim 1 wherein the spatial light modulator comprises a plurality of pixels.

9. The laser of claim 8 wherein the control electronics are configured to adjust at least one pixel of the plurality of pixels in the SLM, wherein the at least one pixel corresponds to the at least one of the plurality of beamlets.

10. The laser of claim 9 wherein the SLM comprises a dual-frequency liquid crystal retarder.

11. The laser of claim 9 wherein the SLM comprises analog ferroelectrics.

12. The laser of claim 9 wherein the SLM comprises a plurality of quantum wells.

13. A diode laser for providing a coherent laser beam having a wavefront, the diode laser comprising:
    a plurality of laser diodes arranged in an array, wherein each of the plurality of laser diodes is configured to produce one of a plurality of beamlets;
    a dual-frequency spatial light modulator (SLM) comprising a plurality of pixels, each pixel corresponding to one of the plurality of laser diodes, wherein the dual-frequency SLM is configured to receive the beamlet from the corresponding laser diode and to adjust the phase of the beamlet in response to a control signal to produce the coherent light beam;
    a beam splitter configured to receive the coherent light beam from the dual-frequency spatial light modulator and to extract a sensing portion of the coherent light beam;

a light detector configured to receive the sensing portion and to produce a feedback signal indicative of the phase of at least one of the plurality of beamlets; and control electronics configured to receive the feedback signal from the light detector and to produce the control signal for the dual-frequency spatial light modulator as a function thereof to produce the coherent light beam with a substantially uniform phase across the wavefront of the coherent light beam; and a gain medium disposed within a lasing cavity and configured to receive the coherent light beam.

14. A laser comprising a light source and a gain medium disposed within a lasing cavity, wherein the light source is configured proximate the gain medium to provide a coherent light beam having a wavefront to the gain medium, and wherein the light source comprises:

a plurality of laser diodes arranged in an array, wherein each of the plurality of laser diodes is configured to produce one of a plurality of beamlets;

a spatial light modulator (SLM) configured to receive the plurality of beamlets and to adjust the phase of at least one of the plurality of beamlets in response to a control signal;

a light detector configured to receive at least a portion of the plurality of beamlets and to produce a feedback signal indicative of the phase of at least one of the plurality of beamlets; and control electronics configured to receive the feedback signal from the light detector and to produce the control signal for the spatial light modulator as a function thereof to produce the coherent light beam with a substantially uniform phase across the wavefront of the coherent light beam.

15. A method of producing a light beam in a diode laser, the method comprising the steps of:

generating a plurality of beamlets from an array of laser diodes, wherein the plurality of beamlets collectively forms the light beam;

directing the light beam to a spatial light modulator having a plurality of pixels, each pixel corresponding to one of the plurality of beamlets;

monitoring the light beam to identify variations in phase between the plurality of beamlets;

for each of the plurality of beamlets, modulating a local index of refraction in the one of the plurality of pixels in the spatial light modulator corresponding to the beamlet to alter the phase of the beamlet and to thereby reduce the variations in phase between the plurality of beamlets in the light beam and to produce a coherent light beam with a substantially uniform phase across the wavefront of the coherent light beam, and directing the coherent light beam toward a gain medium disposed within a lasing cavity.

16. The method of claim 15 wherein the modulating step comprises driving the one of the plurality of pixels at a first frequency to obtain a first index of refraction, and driving the one of the plurality of pixels at a second frequency different from the first frequency to obtain a second index of refraction different from the first index of refraction.

17. The method of claim 15 wherein the modulating step comprises receiving an indication of the variations in phase between the plurality of beamlets, processing the indication to compute a control signal for the spatial light modulator, and providing the control signal to the spatial light modulator to thereby reduce the variations in phase between the plurality of beamlets.

18. A device for producing a light beam, the device comprising:

means for generating a plurality of beamlets, wherein the plurality of beamlets collectively forms the light beam;

means for directing the light beam to a spatial light modulator having a plurality of pixels, each pixel corresponding to one of the plurality of beamlets;

means for monitoring the light beam to identify variations in phase between the plurality of beamlets; and means for modulating an individual index of refraction for each of the plurality pixels in the spatial light modulator to alter the phase of the beamlet associated with the pixel to thereby reduce the variations in phase between the plurality of beamlets in the light beam and to produce a coherent light beam with a substantially uniform phase across the wavefront of the coherent light beam; and means for directing the coherent light beam toward a gain medium disposed within a lasing cavity.

* * * * *